United States Patent
Thompson et al.

(10) Patent No.: US 7,958,629 B2
(45) Date of Patent: Jun. 14, 2011

(54) OVERMOLDED ELECTRONIC MODULE WITH AN INTEGRATED ELECTROMAGNETIC SHIELD USING SMT SHIELD WALL COMPONENTS

(75) Inventors: Philip H. Thompson, Solon, IA (US); Larry D. Pottebaum, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 12/484,591

(22) Filed: Jun. 15, 2009

(65) Prior Publication Data

US 2009/0249619 A1 Oct. 8, 2009

Related U.S. Application Data

(63) Continuation of application No. 11/708,382, filed on Feb. 19, 2007, now abandoned, which is a continuation-in-part of application No. 10/793,618, filed on Mar. 4, 2004, now Pat. No. 7,198,987.

(51) Int. Cl.
*H05K 3/34* (2006.01)
*H05K 3/30* (2006.01)

(52) U.S. Cl. ........................... 29/840; 29/832

(58) Field of Classification Search .................. 29/832, 29/840–842, 846–847, 592.1, 739; 174/255, 174/260, 262, 264, 269; 361/792–795, 760–762
See application file for complete search history.

(56) References Cited

U.S. PATENT DOCUMENTS

| | | | | |
|---|---|---|---|---|
| 3,816,911 A * | 6/1974 | Knappenberger | | 29/841 |
| 4,151,637 A * | 5/1979 | Zemek et al. | | 29/566.1 |
| 4,241,497 A * | 12/1980 | Du Bois | | 29/839 |
| 4,245,385 A * | 1/1981 | Zemek et al. | | 29/564.8 |
| 4,447,945 A * | 5/1984 | Priscsak | | 29/566.3 |
| 4,724,613 A * | 2/1988 | Dale | | 29/856 |
| 4,857,483 A * | 8/1989 | Steffen et al. | | 264/272.17 |
| 5,428,508 A * | 6/1995 | Pronto | | 361/818 |
| 5,940,964 A * | 8/1999 | Mugiya | | 29/840 |
| 6,192,577 B1 * | 2/2001 | Larsson | | 29/840 |
| 6,202,294 B1 * | 3/2001 | Bogannam | | 29/764 |
| 6,449,828 B2 * | 9/2002 | Pahl et al. | | 29/600 |
| 6,947,295 B2 * | 9/2005 | Hsieh | | 361/818 |
| 6,994,901 B1 * | 2/2006 | Chen et al. | | 428/121 |
| 2001/0013165 A1 * | 8/2001 | Hansen et al. | | 29/407.05 |
| 2002/0083570 A1 * | 7/2002 | Inoue et al. | | 29/428 |
| 2007/0071886 A1 * | 3/2007 | Babb et al. | | 427/96.3 |

* cited by examiner

*Primary Examiner* — A. Dexter Tugbang
*Assistant Examiner* — David P Angwin
(74) *Attorney, Agent, or Firm* — Knobbe, Martens, Olson and Bear LLP

(57) ABSTRACT

A method for making an electronic module with an integrated electromagnetic shield uses surface mount shield wall components. At least one electronic component and two or more of the shield wall components are mounted on a surface of a circuit board panel using a pick-and-place process. Each shield wall component has a conductive portion and a non-conductive portion mounted in contact with the surface of the circuit board panel. The mounted shield wall components form a conductive wall to electromagnetically shield the electronic component. The non-conductive portion of one or more of the mounted shield wall components is sawn through, leaving some or all of the conductive portion of the mounted shield wall components. A top conductive shield can be applied. The non-conductive portions can provide stability during a reflow soldering process, while the sacrificial non-conductive portions are sawn through so that they can be removed to reduce the amount of area occupied by the overmoldable shield structure.

9 Claims, 3 Drawing Sheets

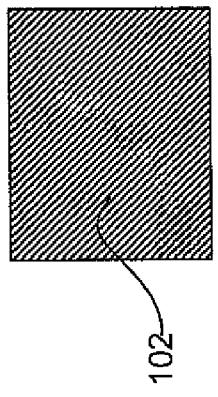
FIG. 1B (End View)
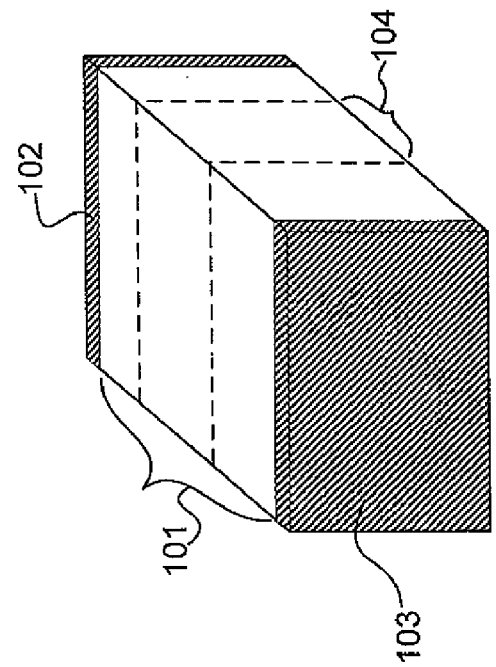
FIG. 1D (Perspective View)
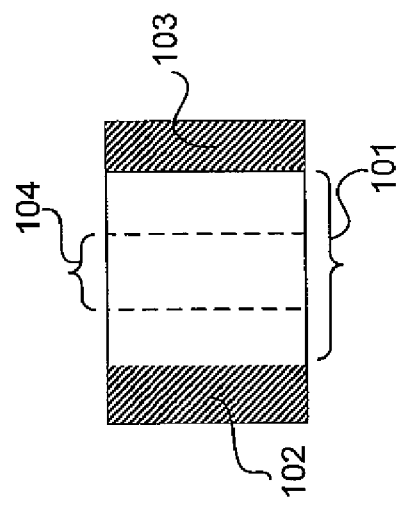
FIG. 1A (Top View)
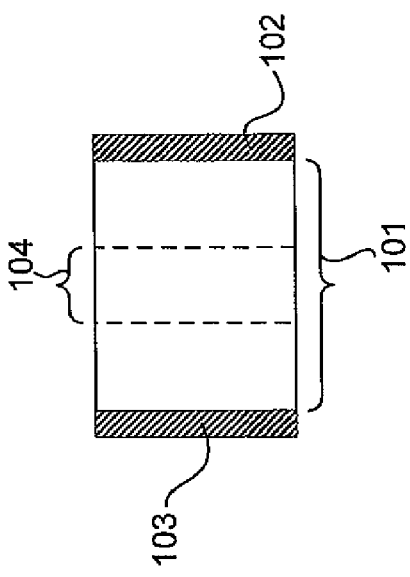
FIG. 1C (Side View)

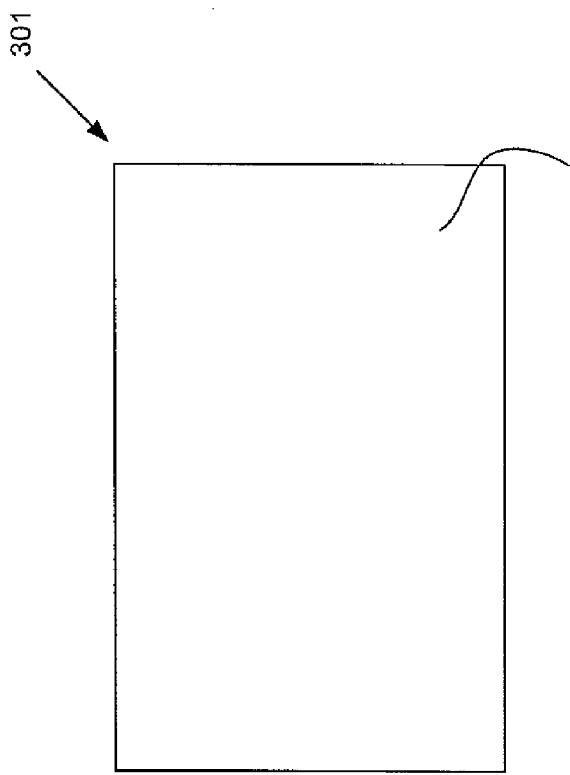
FIG. 3A (Top View)
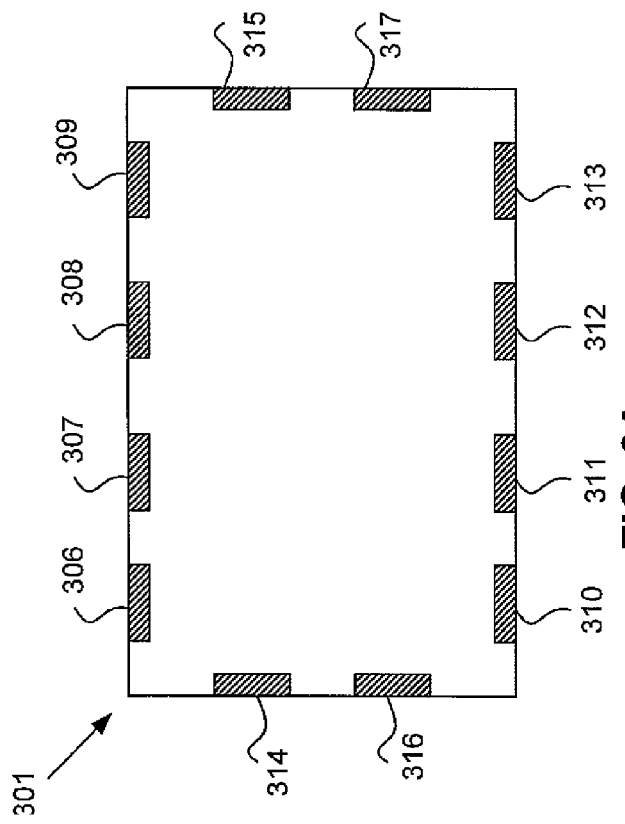
FIG. 3B (Side View)
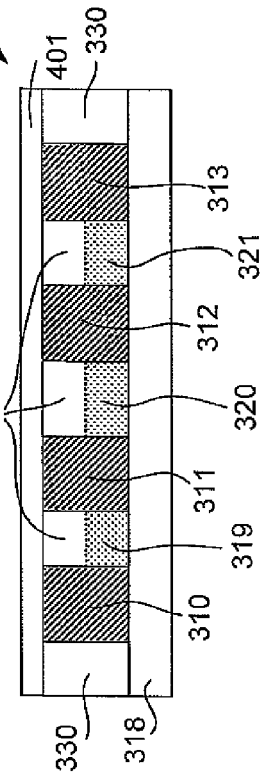
FIG. 4A (Top View)
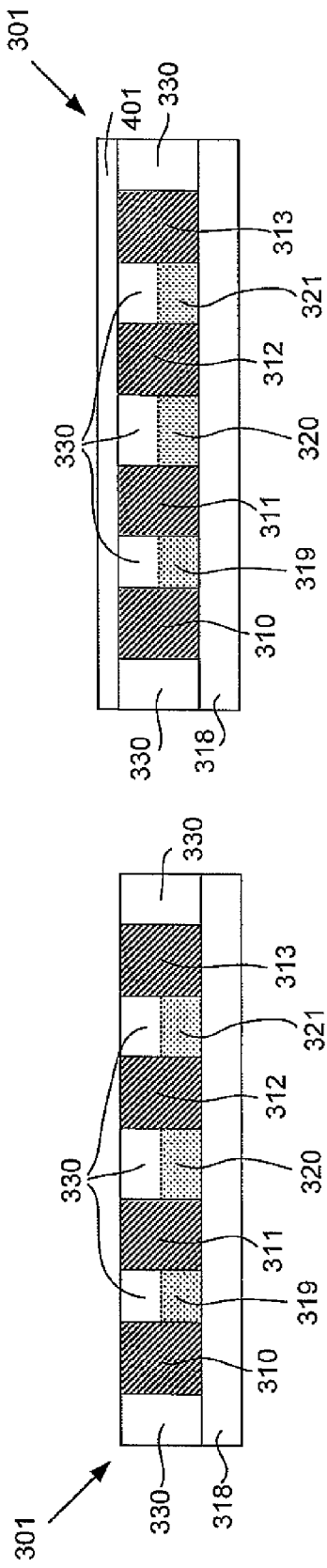
FIG. 4B (Side View)

OVERMOLDED ELECTRONIC MODULE WITH AN INTEGRATED ELECTROMAGNETIC SHIELD USING SMT SHIELD WALL COMPONENTS

CROSS-REFERENCE TO RELATED APPLICATIONS

This is a continuation of U.S. patent application Ser. No. 11/708,382, filed Feb. 19, 2007, which is a continuation-in-part of U.S. patent application Ser. No. 10/793,618, filed Mar. 4, 2004, the benefits of the filing dates of which are hereby claimed and the specifications of which are incorporated herein by this reference.

BACKGROUND

1. Field of the Invention

The invention relates generally to electronic device manufacturing and more particularly to techniques for providing shielding for electronic components.

2. Related Art

Portable electronic devices such as cell phones typically utilize electronic modules to provide a high level of functionality in a small package. The electronic module can include, for example, any combination of one or more integrated circuits and one or more passive devices such as resistors, capacitors, and inductors mounted on a module circuit board. The components of the electronic module can be encapsulated using a non-conductive material to form an overmolded electronic module package. Electronic circuits within an electronic module typically receive, transmit and/or internally utilize time-varying electromagnetic signals. Such electromagnetic signals can radiate through the non-conductive packaging material of the electronic module and affect other electronic devices (e.g., cause interference), exceed regulatory limits, and/or be subject to interception. Also, externally present magnetic energy of either natural or artificial origin may penetrate non-conductive packaging material of an electronic module to adversely affect the circuitry within the electronic module. Accordingly, good engineering practices dictate that electromagnetic shielding be provided to attenuate electromagnetic energy to limit potentially adverse effects. Typically electromagnetic shielding is provided by surrounding the electronic module with a conductive material such as a structure that is stamped or otherwise formed out of a thin sheet of metal. However, such a stamped shield needs to be large enough to avoid mechanically interfering with the electronic module. Moreover, the dimensions of the shield have to be sufficient to accommodate manufacturing tolerances of the electronic module, as well as those of the shield. The additional size required by a stamped shield limits miniaturization of products including such electronic modules. Another disadvantage of a stamped shield is that attaching the shield involves an additional manufacturing step that cannot be performed until after installing the electronic module.

Thus, a technique for providing electromagnetic shielding that avoids such disadvantages is needed.

SUMMARY

The present invention is directed to a method and apparatus for providing an overmolded electromagnetic shield for an electronic module. The invention addresses and resolves the need in the art for a cost-effective shield for an overmolded electronic module that does not substantially increase the module size and overcomes the need for a separate shield, such as a stamped shield, and a separate process for installing the separate shield.

According to one exemplary embodiment, an overmolded electronic module includes any combination of one or more integrated circuits and passive SMT (surface mount technology) components situated on a module circuit board. The overmolded electronic module further includes one or more SMT shield wall components situated on the same module circuit board where the SMT shield wall components form the side walls of an electromagnetic shield. The overmolded electronic module further includes an overmold material used to enecapsulate the components within the electronic module. The overmolded electronic module further includes a conductive layer situated on the top surface of the overmold material where the conductive layer forms the top of an electromagnetic shield. According to this exemplary embodiment, the conductive layer that forms the top of the electromagnetic shield is electrically connected to the SMT shield wall components which in turn are electrically connected to SMT pads on the module circuit board in such a way that the components within the electronic module are surrounded by the shielding structure.

In accordance with at least one embodiment, the SMT shield wall components have form factors compatible with existing SMT component assembly requirements. For example, the SMT shield wall components may be implemented in a size and shape similar to a typical SMT component, such as a resistor or capacitor, but with a body of sacrificial, nonconductive material joining the conductive shield wall sections. Accordingly, the SMT shield wall components may be placed in an electronic module using typical SMT component assembly processes, for example typical SMT pick-and-place processes.

Multiple module circuit boards can be arranged in an array on a circuit board panel or strip with a space between the module circuit boards that is used as a saw street when the module circuit boards go through a singulation process. The design of the SMT shield wall components allows them to be placed between module circuit boards in the saw street such that one SMT shield wall component can provide a first shield wall section for a a given module circuit board and a second shield wall section for an adjacent module circuit board. The result is a shield wall component that has a footprint that is large enough relative to the height of the shield wall component to be easy to manufacture and to provide mechanical stability and withstand subsequent overmolding processes while occupying minimal space in the final completed overmolded electronic module since much of the SMT shield wall component (e.g., a sacrificial portion) is situated in the saw street and removed during the singulation process.

Other features and advantages of the present invention will become more readily apparent to those of ordinary skill in the art after reviewing the following detailed description and accompanying drawings.

BRIEF DESCRIPTION OF THE FIGURES

FIGS. 1A, 1B, 1C and 1D are diagrams of a surface mount technology (SMT) shield wall component comprising two conductive wall sections that are situated at the ends of a non-conductive, sacrificial portion in accordance with at least one embodiment. FIG. 1A is a top view diagram of the SMT shield wall component. FIG. 1B is an end view diagram of the SMT shield wall component. FIG. 1C is a side view diagram of the shield wall component. FIG. 1D is a perspective view diagram of the SMT shield wall component.

FIG. 3A is a top view diagram of a module circuit board with exposed conductive portions of SMT shield wall components in accordance with at least one embodiment.

FIG. 3B is a side view diagram of a module circuit board with exposed conductive portions of SMT shield wall components in accordance with at least one embodiment.

FIG. 4A is a top view diagram of a module circuit board with a top conductive shield coupled to exposed conductive portions of SMT shield wall sections in accordance with at least one embodiment.

FIG. 4B is a side view diagram of a module circuit board with a top conductive shield coupled to exposed conductive portions of SMT shield wall sections in accordance with at least one embodiment.

DETAILED DESCRIPTION

Figure 2:
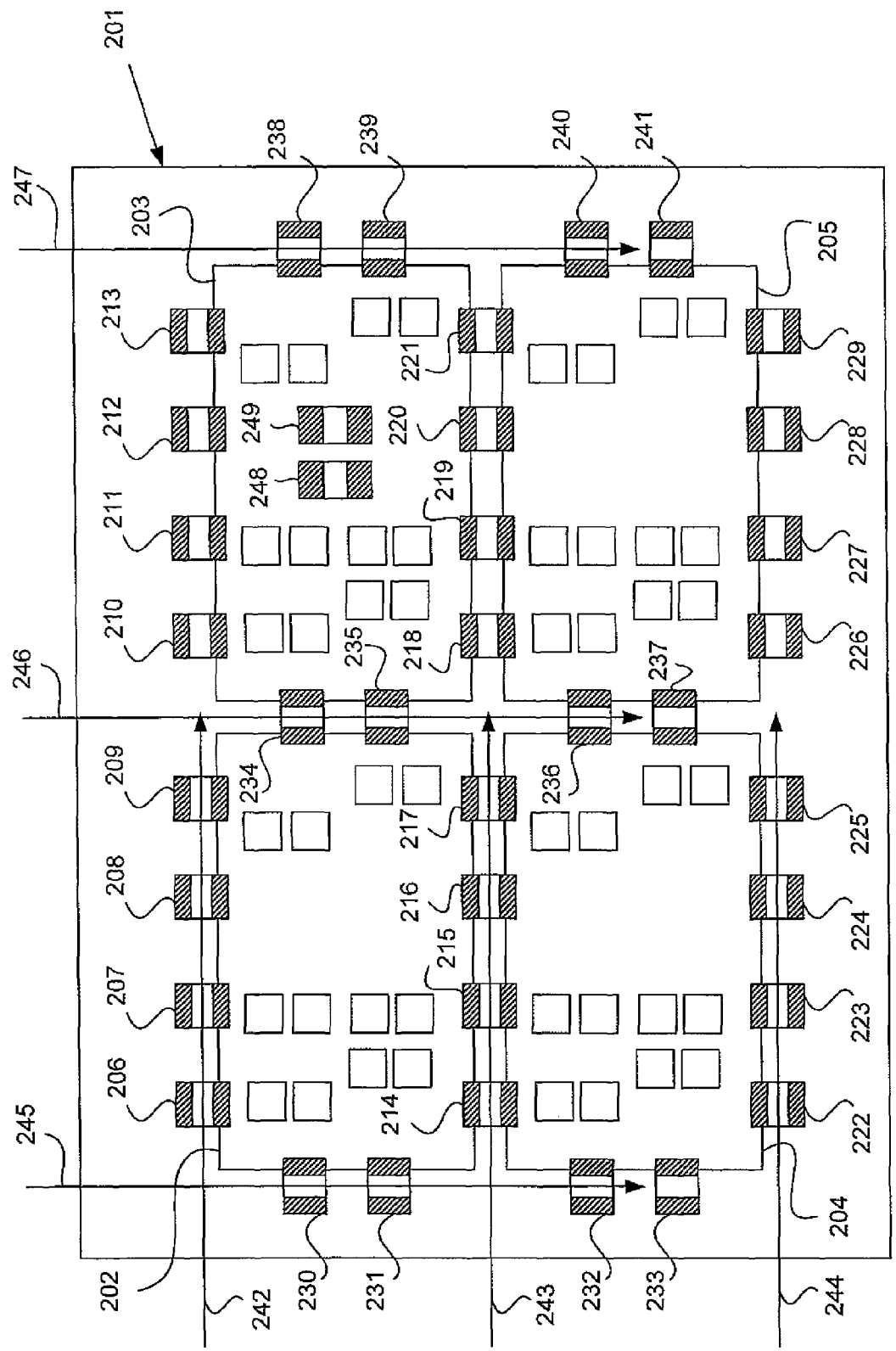
FIG. 2 is a plan view diagram of a circuit board panel for overmolded electronic modules with an integrated electromagnetic shield using SMT shield wall components that includes multiple module circuit boards arranged in an array with saw streets situated between the individual module circuit boards in accordance with at least one embodiment.

The present invention is directed to a method and apparatus for an electronic module with an overmolded electromagnetic shield using SMT shield wall components. The following description contains specific information pertaining to the implementation of the present invention. One skilled in the art will recognize that the present invention may be implemented in a manner different from that specifically discussed herein. Moreover, some of the specific details of the invention are not discussed in order not to obscure the invention. The specific details not described herein are within the knowledge of a person of ordinary skill in the art.

The drawings herein and their accompanying detailed description merely describe exemplary embodiments of the invention. To maintain brevity, other embodiments of the invention which use the principles of the present invention are not specifically described herein and are not specifically illustrated herein by the present drawings. It should be noted that similar numerals generally refer to similar elements in the various drawings.

The method and apparatus for providing an electromagnetic shield structure using an SMT shield wall component that can be at least partially integrated within an overmolded part, for example, an electronic module within a module circuit board which includes integrated circuits, and surface mount components. Surface mounted components within the electronic module are typically attached to a module circuit board residing in a circuit board panel using a pick-and-place process. A reflow soldering process is used to solder the surface mount components to the circuit board. To provide a top conductive shield connection a conductive structure is needed that extends above the height of the integrated circuits and/or surface mount components. However, tall conductive structures tend to lose mechanical stability and become misaligned during the reflow soldering process. If an attempt is made to increase the width of the tall conductive structure to increase its stability, the additional width could reduce usable surface area of the circuit board which results in a significant increase in the size of the circuit board and the complete electronic module.

According to at least one embodiment, a SMT shield wall component is provided that is similar enough to form factors of existing components to allow compatibility with SMT pick-and-place processes, but which provides a sacrificial non-conductive portion that provides increased stability during reflow soldering processes but can be subsequently removed if the SMT shield wall component is mounted so that the sacrificial portion is located over the saw street. This reduces the size of the SMT shield wall component to an optimal size for providing a side wall shielding structure and shielding structure interconnect to a top conductive shield structure. The SMT shield wall component comprises a non-conductive sacrificial portion and a first conductive shield wall section coupled to the non-conductive sacrificial portion. The surface mount component typically comprises a second conductive shield wall section coupled to the non-conductive sacrificial portion opposite the first conductive shield wall section.

Unlike traditional surface mount components, a SMT shield wall component would not need conductive internal portions. Rather, providing a non-conductive sacrificial portion coupled to a conductive shield wall section would allow the non-conductive sacrificial portion to be removed (e.g., by sawing) without releasing conductive debris that might settle and form undesired electrical connections. Preferably, the non-conductive sacrificial portion comprises epoxy or another polymer resin similar to the non-conductive overmold material used for overmolding the entire electronic module. One or more conductive shield wall sections remain after removal of the non-conductive sacrificial portion of the SMT shield wall component to provide side wall shielding and connection to a top conductive shield. The one or more conductive shield wall sections preferably comprise metal (e.g., tin plated copper) that may be preferably soldered to the conductive circuit board pads upon which the SMT shield wall components may be mounted. The conductive circuit board pads are preferably connected to a ground plane within the circuit board. The conductive circuit board pads are optionally connected to package pins on the electronic module that are subsequently connected to a ground plane within the module circuit board on which the electronic module is mounted.

The presently available pick-and-place process for mounting surface mount components can be used to mount surface mount shield wall components as well as other passive and/or discrete surface mount components, which are preferably mounted and reflow soldered before mounting and wirebonding any integrated circuits that may be included in the electronic module.

After being populated with components (e.g., integrated circuits and/or passive SMT components), an environmentally protective material (e.g., a mold compound) may be applied to the circuit board panel (e.g., by injection molding) to cover the one or more electronic modules residing on the circuit board panel. After the overmold process is complete, the conductive shield wall sections of the SMT shield wall components are exposed (e.g., by milling or planing the top surface of the overmolded circuit board panel) in order to provide an electrical connection to the top conductive shield. Thereafter, a conductive material is applied to the top surface of the module circuit boards to form the top conductive shield. After the conductive material is applied to form the top conductive shield, the circuit board panel is singulated into individual electronic modules, each residing in a respective module circuit board. During singulation, a saw cuts through a saw street, which is a sacrificial margin between module circuit boards defined on a circuit board panel. The singulation saw, while removing the circuit board material and mold compound along the saw street, also removes the non-conductive sacrificial portion of the SMT shield wall component.

Surface mount shield wall components may be mounted around a periphery of an electronic module circuit board.

Alternatively or in conjunction with ones mounted around the periphery, surface mount shield wall components may be mounted internal to an electronic module circuit board, for example to provide intramodule shielding.

The SMT shield wall components in accordance with at least one embodiment described herein are useful for electronic modules that transmit, receive, or internally utilize electromagnetic energy, for example, signals in the 100 MHz to 5 GHz range. An example of a module circuit board for which the SMT shield wall components would be useful is a radio frequency (RF) module, for example, a power amplifier module (PAM), a transmit front-end module (TXFEM), a voltage-controlled oscillator (VCO), a RF mixer, etc.

FIGS. 1A, 1B, 1C, and 1D show different views of a surface mount technology (SMT) shield wall component comprising a non-conductive sacrificial portion in accordance with at least one embodiment. FIG. 1A is a top view diagram of the SMT shield wall component. The SMT shield wall component comprises conductive shield wall section 102 and, optionally, conductive shield wall section 103, as well as non-conductive portion 102, including non-conductive sacrificial portion 104. Non-conductive portion 101 is coupled to conductive shield wall sections 102 and, if present, shield wall section 103. Sacrificial portion 104 of the SMT shield wall component need not be of precise width, but may vary in width, for example, depending on process parameters, such as singulation saw kerf width. For some uses (e.g., intramodule shielding), sacrificial portion 104 need not be removed, but may be left intact.

FIG. 1B is an end view diagram of the SMT shield wall component. While the SMT shield wall component comprises non-conductive portion 101, including non-conductive sacrificial portion 104, only shield wall section 102 is depicted in this end view diagram. FIG. 1C is a side view diagram of the SMT shield wall component. Conductive shield wall section 102, non-conductive portion 101, and optional conductive shield wall section 103 are depicted in FIG. 1C. FIG. 1D is a perspective view diagram of the SMT shield wall component. Shield wall section 102, non-conductive portion 101, and optional shield wall section 103 are depicted in FIG. 1D.

FIG. 2 is a plan view diagram of circuit board panel 201 in accordance with at least one embodiment. Circuit board panel 201 comprises module circuit boards 202, 203, 204, and 205. Conductive pads are provided on module circuit boards 202, 203, 204, and 205, either around the periphery of the module circuit boards and/or internal to the module circuit boards, to allow mounting of SMT shield wall components. FIG. 2 depicts SMT shield wall components mounted on such pads, for example, SMT shield wall components 206 through 241 are mounted around the periphery of module circuit boards 202 through 205, and SMT shield wall components 248 and 249 are mounted internal to module circuit board 203.

As illustrated, by using SMT shield wall components having a first conductive shield wall section on one end coupled to a non-conductive sacrificial portion in the middle, which is in turn coupled to a second conductive shield wall section on the opposite end, the first conductive shield wall section (e.g., the first conductive shield wall section of SMT shield wall component 214) can be mounted on a pad at the periphery of a first module circuit board (e.g., module circuit board 202), while the second conductive shield wall section (e.g., the second conductive shield wall section of SMT shield wall component 214) can be mounted on a pad at the periphery of a module second circuit board (e.g., module circuit board 204). Such bridging of adjacent module circuit boards by a SMT shield wall component allows the first conductive shield wall section of the SMT shield wall component to be used to provide side wall shielding and coupling to a top conductive shield for the module first circuit board while allowing the second conductive shield wall section of the SMT shield wall component to be used to provide side wall shielding and coupling to a top conductive shield for the second module circuit board. The non-conductive sacrificial portion of the SMT shield wall component between the first and second conductive shield wall sections of the SMT shield wall component can be removed along with circuit board material between the module first circuit board and the module second circuit board by singulating the module circuit boards, for example, using a singulation saw. Singulation can occur along paths through the circuit board and/or SMT shield wall components, for example, cutting paths 242, 243, 244, 245, 246, and/or 247 depicted in FIG. 2.

FIG. 3A is a top view diagram of electronic module 301 with exposed conductive shield wall sections of the SMT shield wall components in accordance with at least one embodiment. The top portions of conductive shield wall sections of the SMT shield wall components may be exposed either by using an overmolding process that allows them to remain exposed or by using a material removal process after overmolding to expose the conductive shield wall sections of the SMT shield wall components. Examples of such material removal processes include milling, grinding, lasing, and/or planing. With the conductive shield wall sections 306, 307, 308, 309, 310, 311, 312, 313, 314, 315, 316, and 317 of the SMT shield wall components exposed, the remaining components on module circuit board 318 preferably remain encapsulated within the mold compound, as depicted in side view FIG. 3B.

FIG. 3B is a side view diagram of electronic module 301 with exposed conductive portions of the SMT shield wall components in accordance with at least one embodiment. In accordance with at least one embodiment, the tops of conductive shield wall sections, such as exemplary shield wall sections 310, 311, 312, and 313 are flush with the top of the encapsulant, i.e. mold compound 330 of electronic module 301. The tops of other surface components, such as exemplary SMT components 319, 320, and 321 are below the tops of the conductive shield wall sections, such as exemplary shield wall sections 310, 311, 312, and 313, and are preferably covered with encapsulant, i.e. mold compound 330.

FIGS. 4A and 4B are top and side view diagrams of electronic module 301 with top conductive shield 401 coupled to exposed conductive shield wall sections of the SMT shield wall components in accordance with at least one embodiment. With the conductive shield wall sections 306 through 317 of the SMT shield wall components exposed, top conductive shield 401 can be applied over the exposed conductive shield wall sections 306 through 317 of the SMT shield wall components and preferably over the mold compound that remains. For example, top conductive shield 401 may be a conformal coating, such as a conductive paint or conductive epoxy, or a thin layer of metal, which may be attached (e.g., soldered) to the exposed conductive shield wall sections 306 through 317 of the SMT shield wall components.

Thus, as described above and according to the present invention, multiple module circuit boards can be arranged in any array on a circuit board panel or strip with a space between the module circuit boards that is used as a saw street when the module circuit boards go through a singulation process. Prior to the singulation process, the SMT shield wall components may be placed in the saw streets between module circuit boards using typical SMT component assembly processes, for example typical SMT pick-and-place processes.

The design of the SMT shield wall components allows them to be placed between module circuit boards in the saw street such that one SMT shield wall component can provide a first shield wall section for a given module circuit board and a second shield wall section for an adjacent module circuit board. The result is a shield wall component that has a footprint that is large enough relative to the height of the shield wall component to be easy to manufacture and to provide mechanical stability and withstand subsequent overmolding processes while occupying minimal space in the final completed overmolded electronic module since much of the SMT shield wall component (e.g., a sacrificial portion) is situated in the saw street and is removed during the singulation process.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and details without departing from the spirit and scope of the invention. Thus, the described embodiments are to be considered in all respects as illustrative and not restrictive. It should also be noted that the invention is not limited to the particular embodiments described herein but is capable of many rearrangements, modifications, and substitutions without departing from the scope of the invention.

Thus, a method and apparatus for an overmolded electronic module with an integrated electromagnetic shield using SMT shield wall components has been described.

What is claimed is:

1. A method for making a shielded electronic module, comprising:
   mounting at least one electronic component on a surface of a circuit board panel using a pick-and-place process; and
   mounting a plurality of shield wall components on the surface of the circuit board panel using the pick-and-place process, each shield wall component comprising a conductive portion and a non-conductive portion, wherein a portion of the conductive portion is mounted in contact with the surface of the circuit board panel to provide electrical contact, and a portion of the non-conductive portion is mounted in contact with the surface of the circuit board panel to provide mechanical stability, the mounted shield wall components surrounding the at least one electronic component, top portions of the mounted shield wall components extending from the surface of the circuit board panel at least as high as a top portion of the at least one electronic component, wherein the mounted shield wall components form a conductive wall to electromagnetically shield the at least one electronic component; and
   sawing the non-conductive portion of one or more of the mounted shield wall components while not sawing at least a portion of the conductive portion of the one or more of the mounted shield wall components.

2. The method claimed in claim 1, wherein:
   mounting at least one electronic component comprises placing the electronic component on the surface of the circuit board and reflow soldering the mounted electronic component while reflow soldering the shield wall components; and
   mounting a plurality of shield wall components comprises placing the plurality of shield wall components on the surface of the circuit board and reflow soldering the shield wall components while reflow soldering the electronic component.

3. The method claimed in claim 1, further comprising sawing a portion of the circuit board panel while sawing the non-conductive portion.

4. The method claimed in claim 1, wherein:
   each shield wall component of the plurality of shield wall components comprises a first conductive portion, a second conductive portion, and a non-conductive portion between the first conductive portion and second conductive portion; and
   the circuit board panel defines a module first circuit board, a module second circuit board, and a spacing region on the circuit board panel between the module first circuit board and a module second circuit board;
   mounting a plurality of shield wall components comprises placing a shield wall component on the surface of the circuit board panel with a portion of the first conductive portion in contact with the surface of the module first circuit board to provide electrical contact with the module first circuit board, a portion of the second conductive portion in contact with the surface of the module second circuit board to provide electrical contact with the module second circuit board, and the non-conductive portion in contact with the spacing region on the circuit board panel between the module first circuit board and a module second circuit board; and
   wherein the sawing step comprises sawing the spacing region to separate the module first circuit board from the module second circuit board while sawing at least a portion of the non-conductive portion in the spacing region.

5. The method claimed in claim 1, further comprising:
   applying an overmold material to the circuit board panel to at least partially encapsulate the electronic component and shield wall components; and
   applying a top conductive shield, the top conductive shield electrically coupled to exposed conductive portions of the shield wall components.

6. The method claimed in claim 5, wherein the overmold material comprises a polymer resin.

7. The method claimed in claim 5, further comprising, after applying the overmold material and before applying the top conductive shield, removing portions of the overmold material covering the conductive portions of one or more shield wall components to expose the conductive portions thereof.

8. The method claimed in claim 5, wherein applying a top conductive shield comprises depositing a conductive layer on a surface of the overmold material and exposed conductive portions of the shield wall components.

9. The method claimed in claim 8, wherein the conductive layer comprises at least one of conductive paint, conductive epoxy, and metal deposition layer.

* * * * *